(12) United States Patent
Tsai et al.

(10) Patent No.: US 12,360,458 B2
(45) Date of Patent: Jul. 15, 2025

(54) RADIATION COLLECTOR (71) Applicant: Taiwan Semiconductor Manufacturing Co., Ltd., Hsinchu (TW)

(72) Inventors: Cheng Hung Tsai, Hsinchu (TW); Sheng-Kang Yu, Hsinchu (TW); Shang-Chieh Chien, Hsinchu (TW); Heng-Hsin Liu, Hsinchu (TW); Li-Jui Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 381 days.

(21) Appl. No.: 17/855,357

(22) Filed: Jun. 30, 2022

(65) Prior Publication Data
US 2024/0004304 A1 Jan. 4, 2024

(51) Int. Cl.
*G03F 7/00* (2006.01)
*H05G 2/00* (2006.01)

(52) U.S. Cl.
CPC ...... *G03F 7/70175* (2013.01); *G03F 7/70033* (2013.01); *H05G 2/0035* (2024.08); *H05G 2/009* (2024.08)

(58) Field of Classification Search
CPC ........ H05G 2/003; H05G 2/005; H05G 2/006; G03F 7/70033
See application file for complete search history.

(56) References Cited

U.S. PATENT DOCUMENTS

| 9,612,370 | B1 * | 4/2017 | Johnson | G02B 5/122 |
| 2013/0228695 | A1 * | 9/2013 | Mizoguchi | G03F 7/70166 359/350 |
| 2016/0242268 | A1 * | 8/2016 | McGeoch | H05G 2/007 |

FOREIGN PATENT DOCUMENTS

JP 2015122313 A * 7/2015 ............. G03B 27/54

* cited by examiner

*Primary Examiner* — David E Smith
(74) *Attorney, Agent, or Firm* — Seed IP Law Group LLP (57) ABSTRACT

Methods and apparatuses for a lithography exposure process are described. The method includes irradiating a target droplet with a laser beam to create an extreme ultraviolet (EUV) light. The methods utilized and the apparatuses include two or more collectors for collecting the generated EUV light and reflecting the collected EUV light to a focal point of one of the collectors. In some embodiments, one of the two collectors includes a ring-shaped collector.

20 Claims, 10 Drawing Sheets

RADIATION COLLECTOR

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that may be created using a fabrication process) has decreased. This scaling-down process generally provides benefits by increasing production efficiency and lowering associated costs. Such scaling-down has also increased the complexity of processing and manufacturing ICs.

For example, there is a growing need to perform higher-resolution lithography processes. One lithography technique is extreme ultraviolet lithography (EUVL). The EUVL employs scanners using light in the extreme ultraviolet (EUV) region, having a wavelength of about 1 nm to about 100 nm. Some EUV scanners provide a projection printing, similar to some optical scanners, except that the EUV scanners use reflective rather than refractive optics, i.e., mirrors instead of lenses.

One type of EUV light source is laser-produced plasma (LPP). LPP technology produces EUV light by focusing a high-power laser beam onto small fuel droplet targets to form highly ionized plasma that emits EUV light with a peak of maximum emission at 13.5 nm. The EUV light is then collected by a collector and reflected by optics towards a lithography exposure object, e.g., a wafer.

Although existing methods and devices for generating EUV light have been adequate for their intended purposes, they have not been entirely satisfactory in all respects. Consequently, it would be desirable to provide a solution for increasing power conversion efficiency from the input energy for ionization.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

"Vertical direction" and "horizontal direction" are to be understood as indicating relative directions. Thus, the horizontal direction is to be understood as substantially perpendicular to the vertical direction and vice versa. Nevertheless, it is within the scope of the present disclosure that the described embodiments and aspects may be rotated in its entirety such that the dimension referred to as the vertical direction is oriented horizontally and, at the same time, the dimension referred to as the horizontal direction is oriented vertically.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments described herein relate to methods and apparatuses for generating electromagnetic radiation useful in lithography processes, such as the lithography process utilized to manufacture semiconductor devices. Embodiments described below refer to the generation of EUV radiation; however embodiments in accordance with the present disclosure are not limited to generation of EUV radiation. The methods and apparatuses described herein increase the conversion efficiency of laser energy to EUV radiation. The throughput of EUV lithography processes is limited by the conversion efficiency of the laser power to EUV radiation generated utilizing the laser energy and also by the amount of the generated EUV radiation that is collected and directed to the lithography system optics. Methods and apparatuses described herein utilize a reflective collector ring to supplement the amount of EUV radiation that is reflected to the intermediate focus of the EUV source collector.

Embodiments in accordance with the present disclosure are generally related to extreme ultraviolet (EUV) lithography systems and methods, but are not limited to EUV lithography systems and methods. More particularly, they are related to apparatuses and methods that increase the power of radiation that is available (in the patterning materials) and is generated from a laser of a given power, e.g., they increase the conversion efficiency of laser used to produce the plasma. In other words, use of apparatuses and/or methods in accordance with embodiments of the present disclosure increase the ratio of the radiation power generated versus the power of the laser used to generate such radiation. In accordance with embodiments of the present disclosure, multiple collectors are used to increase the ratio of the radiation power collected and available for material patterning versus the power of the laser used to generate such radiation. Since throughput of lithographic processes is directly related to the power of the radiation available for the lithographic patterning, implementation of embodiments of methods and apparatuses described herein can increase the throughput of lithographic processes without significantly increasing the power requirements of the process. The collectors, which in some embodiments collect laser produced plasma (LPP) are configured to collect and reflect EUV light and contribute to EUV conversion efficiency and lithography throughput. However, LPP collectors are subjected to damages and degradations due to the impact of particles, ions, radiation, and debris deposition. Other embodiments in accordance with the present disclosure are directed to reducing debris deposition onto LPP collectors formed in accordance with the present disclosure, thereby increasing their usable lifetime.

The advanced lithography processes, methods, and apparatuses described in the current disclosure may be used in many applications, including in the manufacture of fin-type field effect transistors (FinFETs) and field effect transistors including nanostructure or nanosheet structures. For example, the fins of such transistors may be patterned to produce a relatively close spacing between features, for which the methods and apparatuses described herein are well suited to produce.

Figure 1:
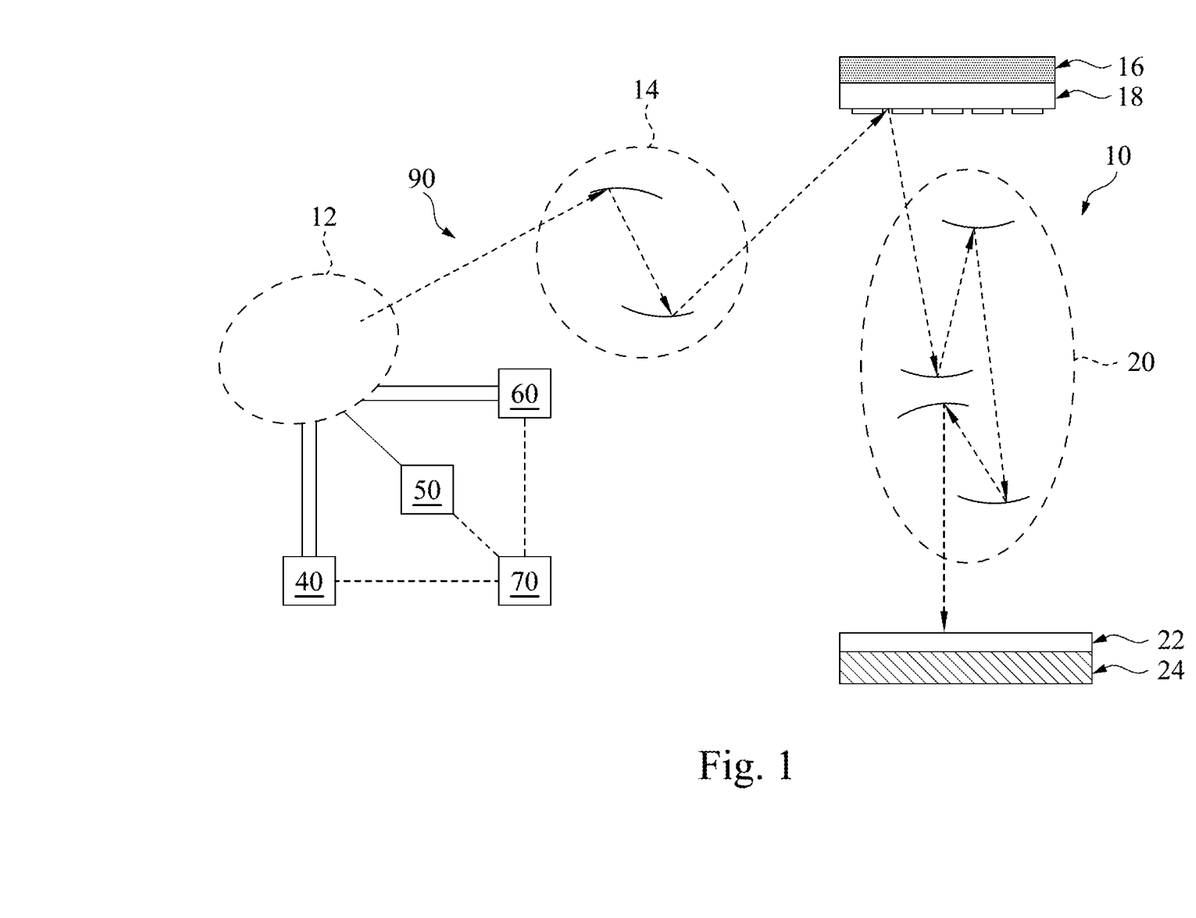
FIG. 1 is a schematic illustration of a lithography system.

FIG. 1 is a schematic view of a lithography system 10, constructed in accordance with some embodiments. The lithography system 10 may also be generically referred to as a scanner that is operable to perform lithography exposure processes. In accordance with embodiments of the present disclosure, the lithography system 10 is an extreme ultraviolet (EUV) lithography system designed to expose a resist layer by EUV light (or EUV light). The resist layer is a material sensitive to the EUV light. It is understood that embodiments in accordance with the present disclosure are not limited to lithography systems for carrying out EUV lithography.

In some embodiments, the EUV lithography system 10 employs a radiation source 12 to generate EUV light 90, such as EUV light having a wavelength ranging between about 1 nm and about 100 nm. In one particular example, the EUV light 90 has a wavelength centered at about 13.5 nm. Accordingly, the radiation source 12 is also referred to as an EUV light source. The EUV light source may utilize a mechanism of laser-produced plasma (LPP) to generate the EUV light, which will be further described later.

The lithography system 10 also employs an illuminator 14. In some embodiments, the illuminator 14 includes various reflective optics such as a mirror system having multiple mirrors in order to direct the EUV light 90 from the radiation source 12 onto a mask stage 16, particularly to a mask 18 secured on the mask stage 16.

The lithography system 10 also includes the mask stage 16 configured to secure the mask 18. In some embodiments, the mask stage 16 includes an electrostatic chuck (e-chuck) to secure the mask 18. In the present disclosure, the terms mask, photomask, and reticle are used interchangeably. In the embodiment described below, the lithography system 10 is a EUV lithography system, and the mask 18 is a reflective mask.

One exemplary structure of the mask 18 includes a substrate with a low thermal expansion material (LTEM). For example, the LTEM may include $TiO_2$ doped $SiO_2$, or other suitable materials with low thermal expansion. The mask 18 includes a reflective multi-layer (ML) deposited on the substrate. The ML includes a number of film pairs, such as molybdenum-silicon (Mo/Si) film pairs (e.g., a layer of molybdenum above or below a layer of silicon in each film pair).

Alternatively, the ML may include molybdenum-beryllium (Mo/Be) film pairs, or other suitable materials that are configurable to highly reflect the EUV light 90. The mask 18 may further include a capping layer, such as ruthenium (Ru), disposed on the ML for protection. The mask 18 further includes an absorption layer, such as a tantalum boron nitride (TaBN) layer, deposited over the ML. The absorption layer is patterned to define a layer of an integrated circuit (IC). The mask 18 may have other structures or configurations in various embodiments.

The lithography system 10 also includes a projection optics module (or projection optics box (POB)) 20 for imaging the pattern of the mask 18 on to a semiconductor substrate 22 secured on a substrate stage (or wafer stage) 24 of the lithography system 10. The POB 20 includes reflective optics in the present embodiment. The EUV light 90 directed from the mask 18, carrying the image of the pattern defined on the mask 18, is collected by the POB 20. The illuminator 14 and the POB 20 may be collectively referred to as an optical module of the lithography system 10.

In the present embodiment, the semiconductor substrate 22 is a semiconductor wafer, such as a silicon wafer or other type of wafer to be patterned. The semiconductor substrate 22 is coated with a resist layer sensitive to the EUV light 90 in the present embodiment. Various components including those described above are integrated together and are operable to perform lithography exposing processes.

The lithography system 10 may further include other modules or be integrated with (or be coupled with) other modules. In the present embodiment, the lithography system 10 includes a gas-supply module 40. The gas-supply module 40 is designed to provide a cleaning gas (e.g., hydrogen gas) to the radiation source 12. The cleaning gas helps reduce contamination in the radiation source 12. In addition, the lithography system 10 includes an exhaust module 60. The exhaust module 60 is designed to extract debris, such as ions, gases and atoms of the target droplet (which will be described in detail below), out of the radiation source 12.

In the present embodiment, the lithography system 10 further includes a radio frequency device 50. The radio frequency device 50 is designed to generate an electric field in the radiation source 12 to convert a cleaning gas into free radicals. In one certain embodiment, the lithography system 10 also includes a controller 70. The controller 70 controls the operation of the radiation source 12, the gas-supply module 40, the radio frequency device 50, and the exhaust module 60.

Figure 2:
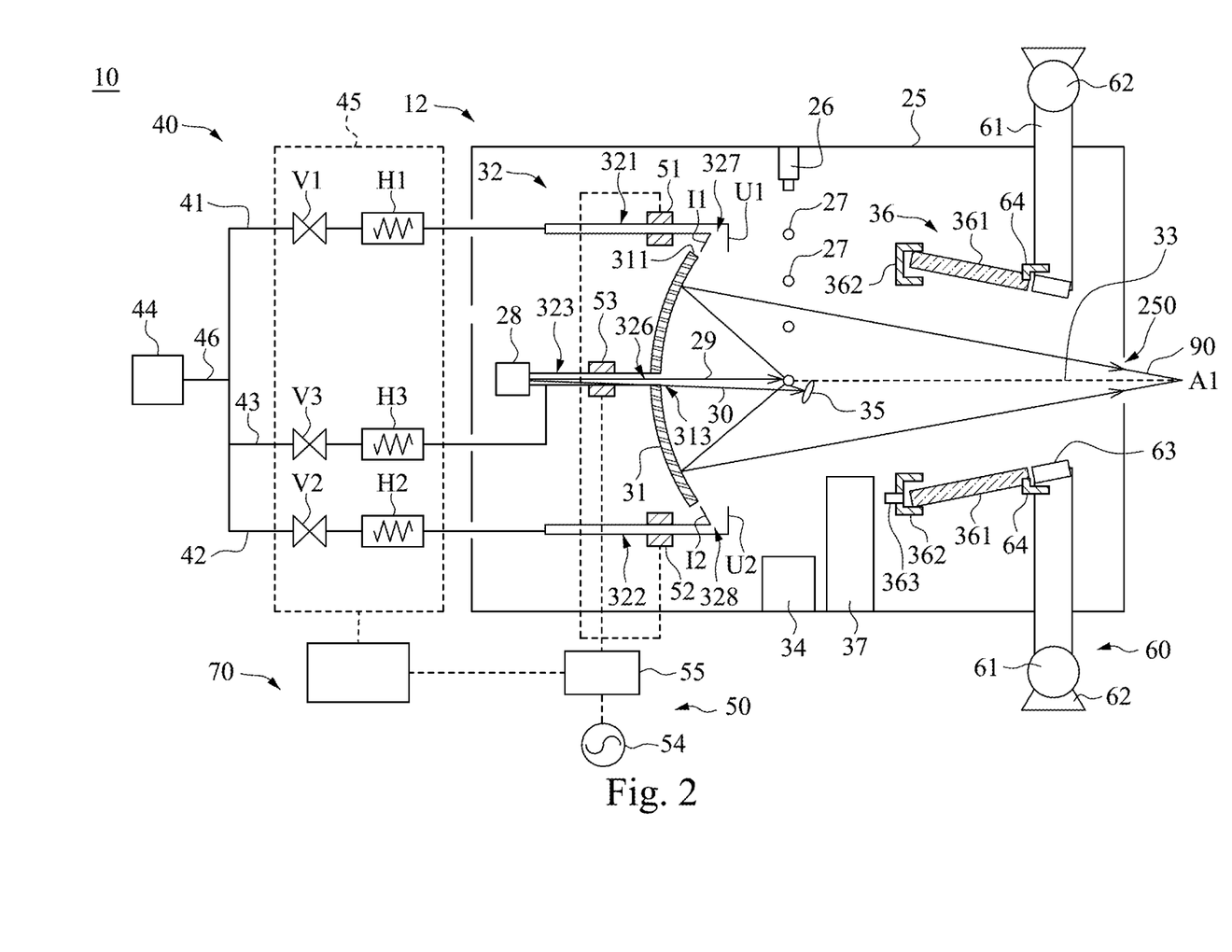
FIG. 2 is a cross-sectional schematic view of a portion of a lithography system in accordance with FIG. 1.

Referring to FIG. 2, in some embodiments, the radiation source 12 employs a laser produced plasma (LPP) mechanism to generate plasma and further generate EUV light from the plasma and includes a target droplet generator 26, a laser source configuration 28, a collector 31, and a gas distributor 32, a droplet catcher 34, and a debris collection mechanism (DCM) 36. The radiation source 12 may be configured in a source vessel 25 which is maintained in a vacuum environment. In accordance with embodiments of the present disclosure, the radiation source 12 further includes an additional collector (not shown in FIG. 2, but illustrated in FIGS. 4A-4C and 5). In some embodiments, this additional collector is positioned concentrically relative to the axial centerline 33 of collector 31 such that the axial centerline of the additional collector and collector 31 coincide.

The target droplet generator 26 is configured to generate a number of target droplets 27. In one certain embodiment, the target droplets 27 are tin (Sn) droplets. In some examples, the target droplets 27 each may have a diameter about 30 microns and are generated at a rate about 50 kilohertz (kHz). The target droplets 27 are introduced into a zone of excitation in the radiation source 12 at a speed about 70 meters per second (m/s) in one example. Other material may also be used for the target droplets 27, for example, a tin-containing liquid material such as eutectic alloy containing tin, lithium (Li), and xenon (Xe).

The laser source configuration 28 may include a carbon dioxide ($CO_2$) laser source, a neodymium-doped yttrium aluminum garnet (Nd:YAG) laser source, or other suitable laser source capable of generating two laser beams 29 and 30. Normally, the two laser beams are implemented as a pre-pulse (PP) laser 29 and main-pulse (MP) laser 30 configuration. Those pulse lasers are directed through an aperture 313 formed through the collector 31, e.g., along the axial centerline 33. In some embodiments, the initial PP laser 29 has sufficient power and pulse duration to heat the target droplet 27 of less than 20 micron dimension and transform the target droplet into a submicron mist which expands to form a pancake-like or dome-like cloud 35 of the droplet material in mist form, sometimes referred to as a precursor target. In some embodiments, the cloud 35 of the mist has a dimension of less than 300 microns and is comprised of atoms of the droplet material. Subsequent to the formation of the cloud 35 of mist, the MP laser 30 with relatively higher power and appropriate duration is fired at a certain angle to impact the cloud 35 of mist, thereby generating high-temperature plasma in which the atoms of the mist are ionized into high charge states. As the ionized atoms of the mist recombine, EUV light 90 is emitted from the plasma. Those laser properties may be applied in the range of power of such 1 to 30 kilowatt and pulse duration of such femtosecond order to nanosecond order, which are related to desired EUV power within the range of several watts to hundreds of watts. In some embodiments, the pulses of the laser source configuration 28 and the droplet generating rate of the target droplet generator 26 are controlled to be synchronized such that the target droplets 27 consistently receive peak powers from the PP laser 29 and the MP laser 30 of the laser source configuration 28.

The droplet catcher 34 is configured to catch any target droplets that are missed by the laser beams 29 and 30. The droplet catcher 34 is installed opposite the target droplet generator 26 and in the direction of the movement of the target droplets 27. In some embodiments, the target droplet generator 26 and the droplet catcher 34 are positioned at two sides of the collector 31.

Figure 3:
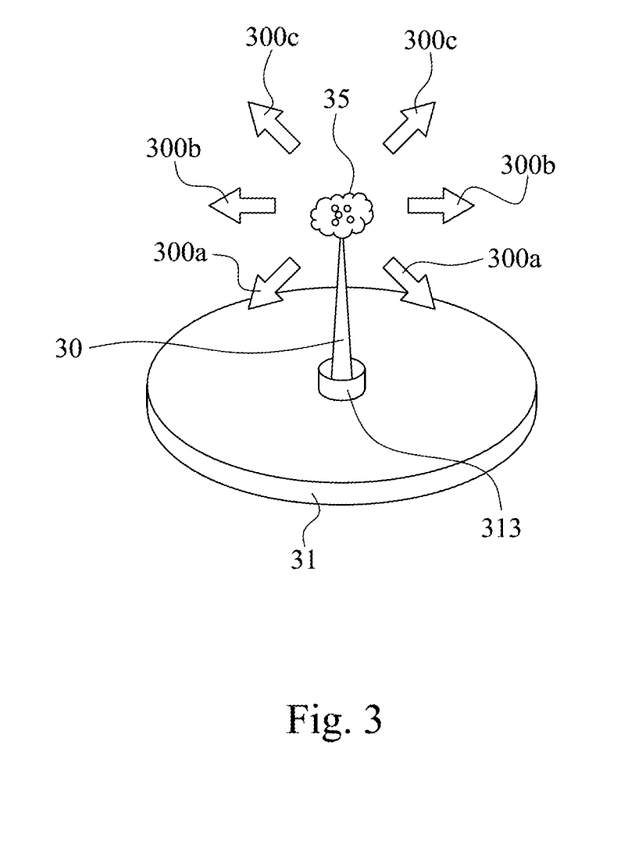
FIG. 3 is a schematic view of generation of radiation from a fuel droplet that has interacted with a laser, in accordance with some embodiments.

Referring to FIG. 3, in some embodiments, the EUV emitted from the mist of target material atoms is emitted in multiple directions as indicated by the arrows 300a, 300b and 300c. For example, in FIG. 3, EUV radiation is emitted in a downward direction represented by arrows 300a which is in the direction of collector 31. As explained below in more detail below, EUV radiation represented by arrows 300a propagates in a direction that results in the EUV radiation represented by arrows 300a impinging upon a surface of collector 31. In other words, EUV radiation represented by arrows 300a propagates in a direction that intersects with a surface of collector 31 and the EUV radiation represented by arrows 300a is intercepted at a surface of collector 31. EUV radiation represented by arrows 300b is emitted in a more generally horizontal direction, which is a direction that is approximately parallel with the surface of collector 31 upon which EUV represented by arrows 300a impinges. In the embodiment of FIG. 3, EUV radiation which is represented by arrows 300b does not impinge upon collector 31. In other words, EUV radiation represented by arrows 300b propagates in a direction that does not intersect a surface of collector 31. The EUV radiation represented by arrows 300b is not intercepted by a surface of collector 31. EUV radiation represented by arrows 300c is emitted in a generally upward direction, which is a direction that is away from the surface of collector 31 upon which EUV represented by arrows 300a impinges. In the embodiment of FIG. 3, EUV radiation which is represented by arrows 300c does not impinge upon collector 31. In other words, EUV radiation represented by arrows 300c propagates in a direction that does not intersect a surface of collector 31. The EUV radiation represented by arrows 300c is not intercepted by a surface of collector 31. In some embodiments the EUV radiation emitted from the mist of target material ions is isotropic while in other embodiments the EUV radiation from the mist of target material ions is not isotropic. It is understood that arrows 300a, 300b and 300c do not represent the entirety of the EUV radiation generated from the mist of target material and that EUV radiation is generated from the mist of target material 35 that travels in directions other than the directions represented by arrows 300a, 300b and 300c, but can be generally categorized as including EUV radiation that travels in a direction that has an upward vector, a downward vector or neither an upward or a downward vector. As illustrated in FIG. 3, the portion of the EUV radiation generated from the mist of target material 35 that is not intercepted by collector 31 and does not impinge upon collector 31 cannot be reflected by collector 31. This negatively affects the efficiency of the conversion of the laser energy to EUV energy, i.e., conversion efficiency.

Figure 4A:
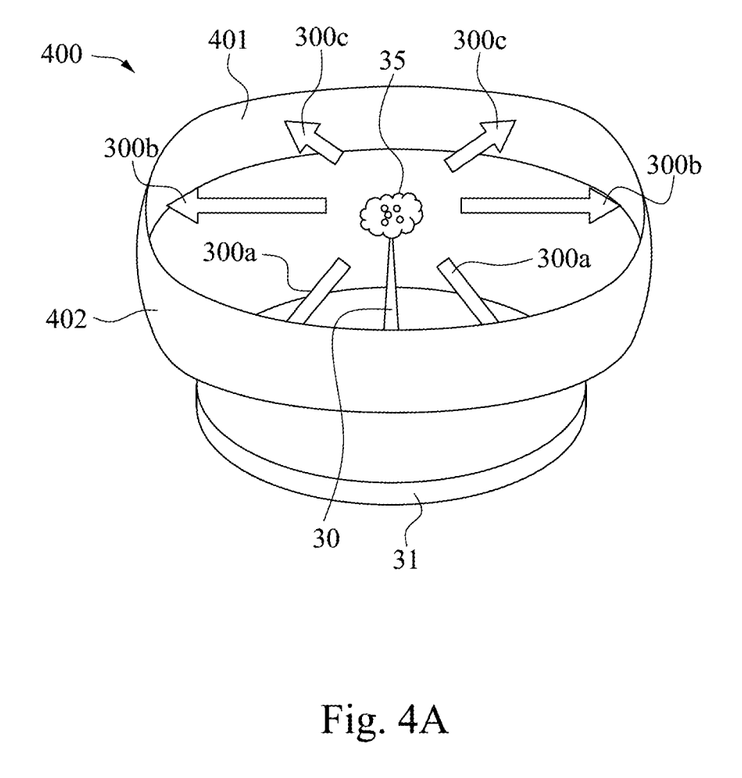
FIG. 4A is a schematic perspective view of a secondary collector of radiation and a primary collector, in accordance with some embodiments.
Figure 4B:
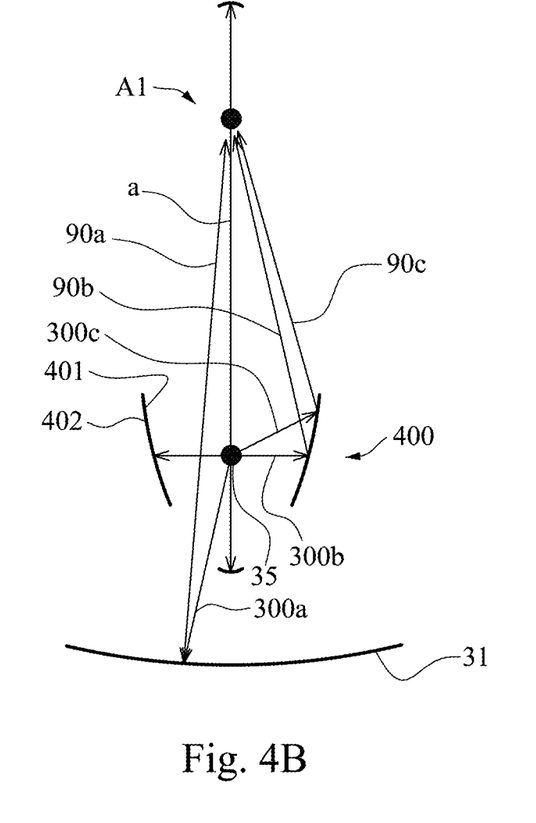
FIG. 4B is a cross-section schematic view of the secondary collector of radiation of FIG. 4A and a cross-section schematic view of a primary collector, in accordance with some embodiments.
Figure 4C:
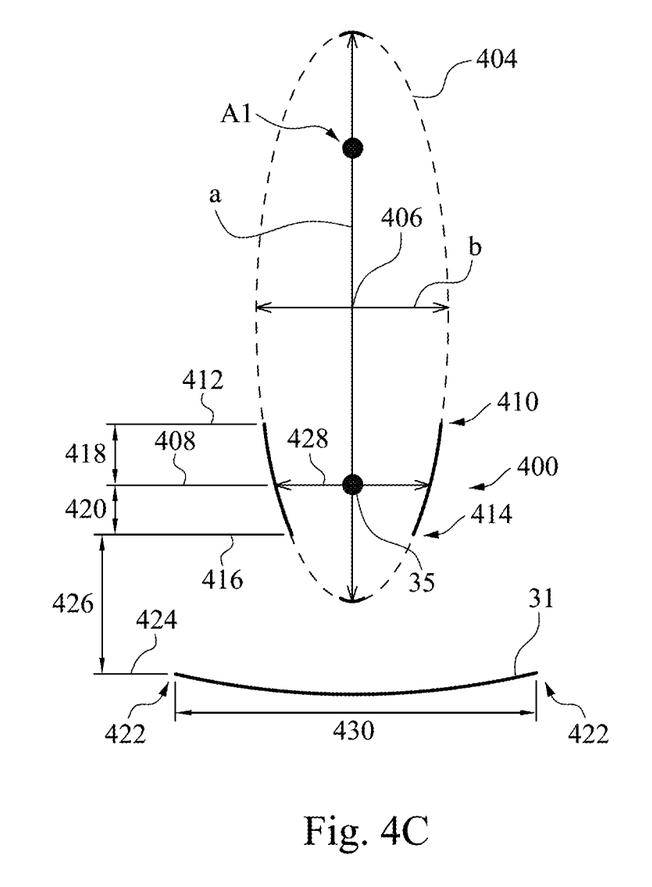
FIG. 4C is a cross-section schematic view of the secondary collector of radiation of FIG. 4A and a cross-section schematic view of a primary collector reflecting EUV radiation in accordance with some embodiments.

In accordance with embodiments of the present disclosure illustrated in FIGS. 4A-4C, a secondary collector 400 illustrated in FIGS. 4A-4C is provided. In the embodiment of FIGS. 4A-4C, secondary collector 400 is a ring-shaped mirror having a concave elliptical inner surface 401 and positioned so that EUV radiation, such as the EUV radiation represented by arrows 300b and 300c is intercepted by and impinges upon an inner surface 401 of secondary collector 400. The EUV radiation represented by arrows 300b and 300c is reflected towards the intermediate focus or focal point A1 (in FIG. 2) of the primary collector 31. In the embodiment of FIGS. 4A-4C secondary collector 400 is a mirror having an outer surface 402 and an inner reflective surface 401, at least the inner reflective surface 401 being elliptical, having an elliptical profile. In other embodiments, portions of the outermost peripheral portions of secondary collector 400 are not elliptical. For example, such outer portions can have a more spherical shape. In some instances, a secondary collector 400 that includes an elliptical portion and a spherical portion may be less challenging to manufacture compared to a secondary collector that includes only an elliptical portion. Referring more specifically to FIG. 4B, as described above with reference to FIG. 4A, EUV radiation emitted by cloud 35 of target material mist includes EUV radiation traveling in the direction of arrows 300a, 300b and 300c. EUV radiation traveling in the direction of arrows 300a impinges upon collector 31 and is reflected directly by collector 31 towards the intermediate focus point A1 of collector 31. This reflected EUV radiation is represented by arrow 90a. In accordance with embodiments of the present disclosure, EUV radiation traveling in the direction of arrow 300b impinges upon an inner surface 401 of secondary collector 400 where it is reflected by secondary collector 400 to the intermediate focus point A1 of primary collector 31. This reflected EUV radiation is represented by arrow 90b. EUV radiation traveling in the direction of arrow 300c impinges upon an inner surface of secondary collector 400 where it is reflected by secondary collector 400 to the intermediate focus point A1 of primary collector 31. This reflected EUV radiation is represented by arrow 90c. Thus, in accordance with embodiments of the present disclosure, secondary collector 400 captures and reflects EUV radiation from cloud 35 that would not impinge upon, not be intercepted by primary collector 31 and not be reflected to intermediate focus point A1 by the primary collector 31. Utilization of secondary collector 400 in accordance with embodiments of the present disclosure causes EUV radiation that impinges on an inner surface of collector 400 to be reflected to the intermediate focus point A1 along a path that is the same as the path that such EUV radiation would travel if it was reflected by the primary collector 31. Utilization of secondary collector 400 in accordance with embodiments of the present disclosure increases the conversion efficiency of the laser power to EUV radiation directed to focal point A1.

In accordance with some embodiments, utilizing methods and apparatuses in accordance with embodiments described herein may increase the conversion efficiency by 50 to 200 percent.

FIG. 4B is a schematic cross-sectional view of secondary collector 400 and primary collector 31 illustrated in FIG. 4A. In FIG. 4B, secondary collector 400 is illustrated in solid lines. FIG. 4C is the same schematic cross-sectional view of secondary collector 400 as in FIG. 4B, with the solid line representation of secondary collector 400 in FIG. 4B overlaid with a broken line ellipse 404 representing shape of the ellipse which defines the curvature of the inner surface 401 of secondary collector 400. Ellipse 404 includes a center 406, a major axis a and a minor axis b. In the illustrated embodiment, one focus of ellipse 404 is coincident with the intermediate focus A1 of primary collector 31 and the other focus of ellipse 404 is coincident with the location where the cloud 35 of target material is generated, i.e., the location where the laser intercepts the droplets of target material. Ellipse 404 can be represented by the mathematical formula:

$$\frac{x^2}{a^2} + \frac{y^2}{b^2} = 1$$

wherein a is the major axis a and b is the minor axis b. In accordance with disclosed embodiments, the foci of ellipse 404 (and the intermediate focus A1 and cloud 35) are separated by a distance in the range of 100 to 160 cm. In some embodiments the foci of ellipse 404 are separated by a distance in the range of 110 cm to 150 cm. Though not illustrated, as noted above, the upper and lower edges of secondary collector 400 in FIG. 4C may include portions that do not fall on ellipse 404. For example, portions of secondary collector 400 at its upper and lower edges can include a spherical, as opposed to an elliptical, shape. In the embodiment illustrated in FIG. 4C, the center point of the secondary collector 400 on each side of the location of cloud 35 and the location of cloud 35 lie in a common plane 408. The top edge 410 of collector 400 lies in a plane 412 spaced above plane 408. The bottom edge 414 of collector 400 lies in a plane 416 space below plane 408. In the embodiment illustrated in FIG. 4C, plane 408 and 412 are spaced apart by a distance 418 and plane 416 and 408 are spaced apart a distance 420. In embodiments of the present disclosure, the ratio of distances represented by 418 and 420 is between 0.5 to 2.0. In other embodiments, the ratio of distances represented by 418 and 420 is about 1.0. When collector 400 has a ratio of distances represented by 418 and 420 that falls within the foregoing range, meaningful amounts of EUV radiation is incident upon secondary collector 400 and is reflected to intermediate focus A1 from secondary collector 400. Embodiments in accordance with the present disclosure are not limited to the ratio of distances represented by 418 and 420 falling within the foregoing range of ratios. In accordance with some embodiments, the sum of distances 418 and 420 falls within the range of 5 to 20 cm.

In the embodiment illustrated in FIG. 4C, primary collector 31 includes upper edges 422 which lie within a plane 424. Plane 424 is separated from plane 416 by a distance 426. In accordance with embodiments of the present disclosure, a ratio of distance 426 (distance between bottom edge of secondary collector 400 and upper edge of primary collector 31) to the sum of distances 418 and 420 (height of secondary collector 400) is in the range of 1 to 2. In accordance with embodiments of the present disclosure, distance 426 is between 5 and 15 centimeters. When the ratio of distance 426 to the sum of distances 418 and 420 or the distance 426 falls within the above ranges, the amounts of EUV radiation captured by primary collector 31 and secondary collector 400 and reflected to intermediate focus A1 results in an increased conversion efficiency compared to when only the primary collector 31 is utilized.

In FIG. 4C, a distance 428 exists between the opposing walls of collector 400. In FIG. 4C primary collector has a diameter 430 at its upper edge 422. In accordance with embodiments of the present disclosure, a ratio of diameter 430 to distance 428 is between 4:1 to 1:1. In other embodiments, this ratio is between 3:1 to 2:1. Embodiments in accordance with the present invention include a distance 428 that is between 15 and 35 centimeters. In some embodiments, the distance 428 is between 20 and 30 centimeters. Embodiments in accordance with the present invention include a diameter 430 between 40 and 80 centimeters and, in some embodiments, between 50 and 70 centimeters. When the ratio of diameter 430 to distance 428, includes distance 428 or diameter 430 falling within these ranges, the amounts of EUV radiation captured by primary collector 31 and secondary collector 400, and reflected to intermediate focus A1, results in an increased conversion efficiency compared to when only the primary collector 31 is utilized.

Embodiments in accordance with the present disclosure provide an effective reflective surface area of the secondary collector 400 that is at least equal to 50% of the effective reflective surface area of primary collector 31. For example, a ratio of the effective surface area of the secondary collector 400 to the effective reflective surface area of the primary collector 31 is at least 0.5:1. In some embodiments, a ratio of the effective surface area of the secondary collector 400 to the effective reflective surface area of the primary collector 31 is at least 1:1 and in some embodiments, the ratio is at least 2:1. When the ratio of the effective surface area of the secondary collector 400 to the effective reflective surface area of the primary collector 31 falls within these ranges, the total effective reflective surface area available to reflect EUV radiation to the intermediate focus A1 is increased compared to if only the primary collector is deployed.

In accordance with embodiments of the present disclosure, dimensions a, b, 418, 420, 426 and 428 are selected so that EUV radiation generated by cloud 35 is able to impinge upon collector 31 and be reflected to intermediate focus A1, while at the same time maximizing the amount of EUV radiation that is reflected by secondary collector 400 to intermediate focus A1. For instance, selection of the foregoing dimensions should take into account minimizing the amount of EUV radiation that is propagating with a downward direction vector which does not impinge upon either the primary collector 31 or the secondary collector 400. In addition, selection of the foregoing dimensions should take into account minimizing the amount of EUV radiation reflected by primary collector 31 toward intermediate focus A1 that would intercept secondary collector 400 and therefore be prevented from reaching intermediate focus A1.

Figure 5:
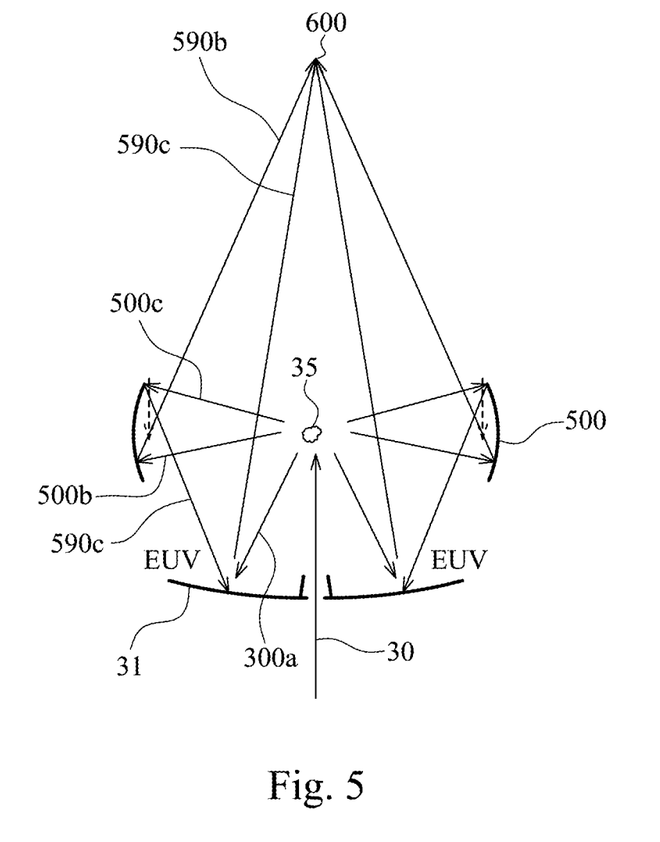
FIG. 5 is a schematic perspective view of a secondary collector and a primary collector in accordance with some alternative embodiments.

In another embodiment illustrated in FIG. 5, the description of features with reference to FIG. 4B applies equally to the features in FIG. 5, wherein they are the same reference numerals as utilized in FIG. 4B. In the embodiment of FIG. 5, the inner reflective surface of secondary collector 500 is capable of reflecting EUV radiation 500c that is incident on the inner reflective surface to collector 31 where it is reflected toward intermediate focus point 600 as indicated by arrows 590c. In the embodiment of FIG. 5, secondary collector 500 is capable of reflecting EUV radiation 500b directly toward intermediate focus point 600 as indicated by arrows 590b. In such embodiment, secondary collector 500 of FIG. 5 will have a different curvature profile than secondary collector 400 of FIGS. 4A-4C. For example, secondary collector 500 may have sections that have different curvature profiles, e.g., non-elliptical curvature, a section with an elliptical curvature and a section with a non-elliptical curvature, e.g., a hyperbolic curvature or other curvatures.

Referring back to FIG. 2, the primary collector 31 is configured to collect, reflect and focus the (1) EUV radiation 300a that is emitted by the plasma and impinges directly thereon, without reflection by an intermediary collector/reflector, and (2) referring to FIG. 4B, the EUV radiation 300b and 300c emitted by the plasma, impinges on the collector ring 400 and is reflected by the collector ring 400 to the intermediate focus point A1 as represented by arrows 90b and 90c, or (3) referring to FIG. 5, the EUV radiation 500c impinges on the collector ring 500 and is reflected to the primary collector 31 as represented by arrow 590c and the EUV radiation 500b impinges on the collector ring 500 and is reflected to the intermediate focus point 600 as represented by arrow 590b.

In some embodiments, the collector 31 is designed to have an ellipsoidal geometry with an aperture 313 formed thereon. The aperture 313 may be formed on a center of the collector 31. Alternatively, the aperture 313 may be located offset from the center of the collector 31. In one certain embodiment, the laser source configuration 28 is positioned relative to the aperture 313, and the laser beams 29 and 30 emitted by the laser source configuration 28 pass through the aperture 313 before its irradiation upon the target droplet 27 as described above.

In some embodiments, the collector 31 and secondary collectors 400 and 500 are designed with proper coating material functioning as a mirror for EUV light collection, reflection, and focus. In some examples, the coating material of the collector 31 and secondary collectors 400 and 500 is similar to the reflective multilayer of the mask 18 (FIG. 1). In some examples, the coating material includes a number of Mo/Si film pairs and may further include a capping layer (such as Ru) coated on the film pairs to substantially reflect the EUV light. In some examples, the collectors may further include a grating structure designed to effectively scatter the laser beam directed onto the collectors. For example, a silicon nitride layer may be coated on the collectors and patterned to have a grating structure.

The gas distributor 32 is configured to discharge a cleaning gas from the gas-supply module 40 to the collector 31. In some embodiments, the gas distributor 32 includes a number of flow guiding members, such as flow guiding members 321, 322 and 323. The flow guiding member 323 is positioned relative to the aperture 313. The flow guiding member 323 may include a tube structure and extends along a straight line. One end 326 of the flow guiding member 323 is directly connected to the aperture 313 and the other end is connected to the laser source configuration 28.

The flow guiding members 321 and 322 are positioned at two sides of the collector 31. Each of the flow guiding members 321 and 322 is formed with a tube structure and includes one or more gas holes located next to the circumference 311 of the collector 31. For example, the flow guiding member 321 includes a number of gas holes positioned relative to the circumference 311 of the collector 31. The gas holes may be configured with the same size, and spaced apart from each other by a predetermined pitch. In addition, the flow guiding member 322 includes a number of gas holes positioned relative to the circumference 311 of the collector 31. These gas holes of flow guiding member 322 may be configured with the same size, and spaced apart from one another by a predetermined pitch.

Continuing to refer to FIG. 2, in some embodiments, each of the flow guiding members 321 and 322 has a cane-like shape cross-section in a plane that is parallel to the optical axis A1. Specifically, the flow guiding member 321 has an end portion 327 connected to a gas hole in flow guiding member 321, and the flowing guiding member 322 has an end portion 328 connected to a gas hole in flow guiding member 322. Extension directions of two side walls of the end portions 327 and 328 intersect with the optical axis A1 by different angles. In one certain embodiment, upper side walls U1 and U2 of the end portions 327 and 328 intersect with the optical axis A1 at an angle about 90 degree, and inner side walls I1 and I2 of the end portions 327 and 328 intersect with the optical axis A1 at an angle less than 90 degrees. As a result, the cleaning gas discharged by the flow guiding members 321 and 322 is redirected to form gas shield toward the surface of collector 31 that is used to reflect and focus the EUV light 90.

The gas-supply module 40 is fluidly connected to the gas distributor 32 and is configured to supply the cleaning gas to the collector 31 via the gas distributor 32. In some embodiments, the gas-supply module 40 includes a gas source 44 and a number of pipelines, such as pipelines 41, 42 and 43. The pipeline 41 fluidly connects the gas source 44 to the flow guiding member 321. The pipeline 42 fluidly connects the gas source 44 to the flow guiding member 322. The pipeline 43 fluidly connects the gas source 44 to the flow guiding member 323. As noted above, this same gas-supply module 40 can supply cleaning gas to gas distributors 632 of FIG. 6.

In some embodiments, since the pipelines 41, 42 and 43 and the flow guiding members 321, 322 and 323 collectively guide cleaning gas supplied from the gas source 44 to the collector 31, the pipelines 41, 42 and 43 and the flow guiding members 321, 322 and 323 are referred to as a gas flowing path.

The gas-supply module 40 further includes a regulating unit 45 configured to regulate the flow of the cleaning gas in the gas-supply module 40 according to a control signal from the controller 70. In some embodiments, the regulating unit 45 includes one or more valves configured to control flowing rate of the cleaning gas in the pipelines 41, 42 and 43. For example, the regulating unit 45 includes three flow rate regulators V1, V2 and V3, such as valves. The three flow rate regulators V1, V2 and V3 are respectively connected to the pipelines 41, 42 and 43. The three flow rate regulators V1, V2 and V3 may be independently controlled by the controller 70 to allow the cleaning gas in the pipelines 41, 42 and 43 have different flowing rates.

In some embodiments, the regulating unit 45 further includes one or more energy converters configured to control temperature of the cleaning gas in the pipelines 41, 42 and 43. For example, the regulating unit 45 includes three energy converters H1, H2 and H3. The three energy converters H1, H2 and H3 are respectively connected to the pipelines 41, 42 and 43. The three energy converters H1, H2 and H3 include heating members that convert electric energy into thermal energy. The energy converters H1, H2 and H3 apply the thermal energy into the cleaning gas in the pipelines 41, 42 and 43 to heat up the cleaning gas to a predetermined temperature. In the following descriptions, the energy converters H1, H2 and H3 are referred to as "first energy converters." These first energy converters may be used to heat the cleaning gas supplied to gas distributors 632.

The predetermined temperature may be a temperature at which at least a portion of cleaning gas is converted to free radicals. That is, at the predetermined temperature, a specific bond between two atoms of the cleaning gas is broken so as to form the free radicals of the cleaning gas. Alternatively, the predetermined temperature may be a temperature that improves the conversion efficiency of the cleaning gas into free radicals as an electromagnetic radiant energy from the radio frequency device 50 is applied to the pre-heated cleaning gas. The first energy converters H1, H2 and H3 may be independently controlled by the controller 70 to allow the cleaning gas in the pipelines 41, 42 and 43 to have different temperatures.

However, it should be appreciated that many variations and modifications may be made to embodiments of the disclosure. In some embodiments, a conduit 46 connects the gas source 44 and the pipelines 41, 42 and 43. The regulating unit 45 includes one valve and one first energy converter connected to the pipelines 41, 42 and 43. In some other embodiments, the pipelines 41, 42 and 43 are omitted, and the gas source 44 is directly connected to the gas distributor 32 via the conduit 46.

Still referring to FIG. 2, the radio frequency device 50 is configured to convert the cleaning gas in the gas distributor 32 into free radicals by electromagnetic radiant energy before the cleaning gas is discharged over the collector 31. In some embodiments, the radio frequency device 50 includes a number of energy converters, such as energy converters 51, 52 and 53. The energy converters 51, 52 and 53 are respectively connected to the flow guiding members 321, 322 and 323. In one certain embodiment, each of the energy converters 51, 52 and 53 includes a pair of electrodes. The energy converters 51, 52 and 53 convert electric energy to electromagnetic radiant energy. In the following descriptions, the energy converters 51, 52 and 53 are referred to as "second energy converters". These second energy converters can be utilized to generate free radicals which will be discharged from gas distributors 632.

The radio frequency device 50 further includes a power source 54 electrically connected to the second energy converters 51, 52 and 53 to supply electromagnetic energy to the second energy converters 51, 52 and 53. The power source 54 may be connected to the second energy converters 51, 52 and 53 via a control circuit 55. The control circuit 55 controls the voltage applied to the second energy converters 51, 52 and 53 according to the control signal from the controller 70.

The DCM 36 is configured to trap the debris of the target droplet 27. The DCM 36 is disposed along the optical axis A1 connecting the aperture 313 of the collector 31 and an output port 250 of the source vessel 25. The DCM 36 includes a number of vanes 361 that are arranged surrounding the optical axis A1. The vanes 361 are thin and elongate plates and are aligned so that their longitudinal axes are parallel to the optical axis A1. The vanes 361 project towards the optical axis A1, but do not extend as far as the optical axis. The DCM 36 is configured to guide any droplet debris attached on the vanes structure. As a result, the vanes 361 serve to prevent such droplet debris directly falling on a surface of the collector 31.

The vanes 361 are configured to guide droplet material debris and cause the droplet material debris to attach to the vanes through thermal control of the vane temperature. For example such temperature control may be performed with warm and hot cycles. The hot cycle is intended to melt the droplet material debris that comes in contact with the vane and avoid formation of contamination due to bubble defect burst at a spitting temperature, and hence the hot cycle is operated at a temperature in the range from about 232 degree C. to about 350 degree C. The spitting temperature range may depend on internal gas components and chamber pressure, for examples the above temperature range applies to conditions of a hydrogen atmosphere and a medium vacuum of several mbar. The warm cycle is intended be performed under conditions that allow the droplet material debris to slide and roll along vane surfaces appropriately. Warm cycle temperatures are in the range from about 100 degree C. to about 232 degree C. Consequently, the temperature of the vane should be adjustable within a range of from about 100 degree C. to about 350 degree C. Furthermore, the droplet material debris trapped by the vanes may flow smoothly into a bottom vane gutter 362. Finally, melting droplet material debris may flow through the drip pipe 363 and fall into a bucket 37 for droplet material waste storage. In one certain embodiment, the EUV light 90 is projected upwardly along the optical axis A1, and thus the melting droplet material is moved via gravity force.

The vanes 361 are made of a suitable material such as stainless steel, Cu, A1 or ceramics. In certain embodiments, the vanes 361 are made of stainless steel. In the present embodiments, the surfaces of vanes 361, are coated with a catalytic layer including ruthenium (Ru), tin (Sn), tin oxide, titanium oxide, or any combination thereof. In some embodiments, Ru is used. For embodiments where the droplet material is tin, the Ru coated surfaces of the vanes 361 reduce $SnH_4$ to Sn, and traps Sn thereon. By applying a catalytic layer made of, for example, Ru, on the surface of vanes in the DCM 36, it is possible to reduce the conversion of $SnH_4$ vapor to metal Sn and to collect debris directly, and thus it is possible to prevent contamination of the collector 31 by Sn debris. It is appreciated that when the target droplet material used to generate EUV radiation is made of a different material than Sn, the same or a different catalytic material may be used as the catalytic material layer.

The exhaust module 60 includes an exhaust line 61, an exhaust pump 62, a heated scrubber 63 and a scrubber gutter 64. One end of the exhaust line 61 is connected to and around the source vessel 25 to receive the exhaust. The heated scrubber 63 is connected to the exhaust line 61 and is configured to guide and trap the debris gas flow (or debris vapor). For example, the heated scrubber 63 has functions of a thermal control for heating or warming, an exhaust filtering and a debris trapping, which may include certain structure(s), such as labyrinth structures, nano rods, and porous macrostructures. When the debris hits the structure, it is heated and condensed into liquid, thereby being "trapped" inside the heated scrubber 63. The debris may be guided and gathered together and collected in a scrubber gutter 64. As a result, the droplet material debris is collected and drained into the vane structure of the DCM 36.

Another end of the exhaust line 61 is connected to the pump 62 which is a vacuum pump. The pump 62 creates gas flow from the source vessel 25 into the heated scrubber 63 and the exhaust line 61, to pump out the exhaust in the source vessel 25. The exhaust of vessel 25 may be further directed into the factory exhaust system.

It should be appreciated that while there are three flow guiding members 321, 322 and 323 illustrated in FIG. 2, this is merely intended for clarity and is not intended to be limiting. Rather, any number of the flow guiding members may additionally be included within the radiation source 12.

Figure 6:
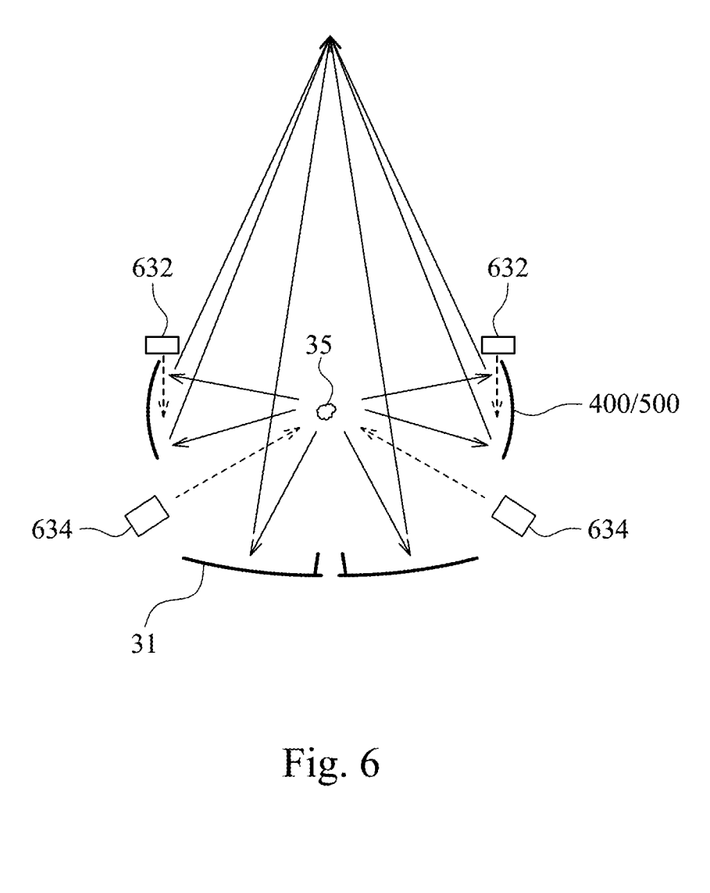
FIG. 6 is a cross-section schematic view of a secondary collector of radiation of FIG. 4A including cleaning a metrology system.

FIG. 6 illustrates other aspects of the embodiments in accordance with the present disclosure. In FIG. 6, similar to FIG. 2, gas distributors 632 are provided to discharge a cleaning gas from the gas-supply module to the inner reflective surface of secondary collector 400/500. In some embodiments, the gas distributor 632 includes a number of flow guiding members or orifices from which the cleaning gas is dispensed. These orifices may be configured with the same size, and spaced apart from each other by a predetermined pitch. In other embodiments, the orifices may not be the same size and may be spaced apart with varying pitches. Orifices are disposed such that cleaning gas discharge from the orifices flows across the inner surface of the secondary collector 400 to displace unwanted material, e.g., particles of target materials droplets. The description above regarding FIG. 2 and the cleaning system utilized to clean primary collector 31 is equally applicable to the implementation of a cleaning system for cleaning secondary collector 400/500. In addition, in the embodiment illustrated in FIG. 6, in order to synchronize the timing of the laser pulses to optimize its contact with droplets of the target material mist 35, various sensors 634 are provided. Data collected from sensors 634 can be analyzed to optimize exposure of the target material droplets with the laser pulses.

Figure 7:
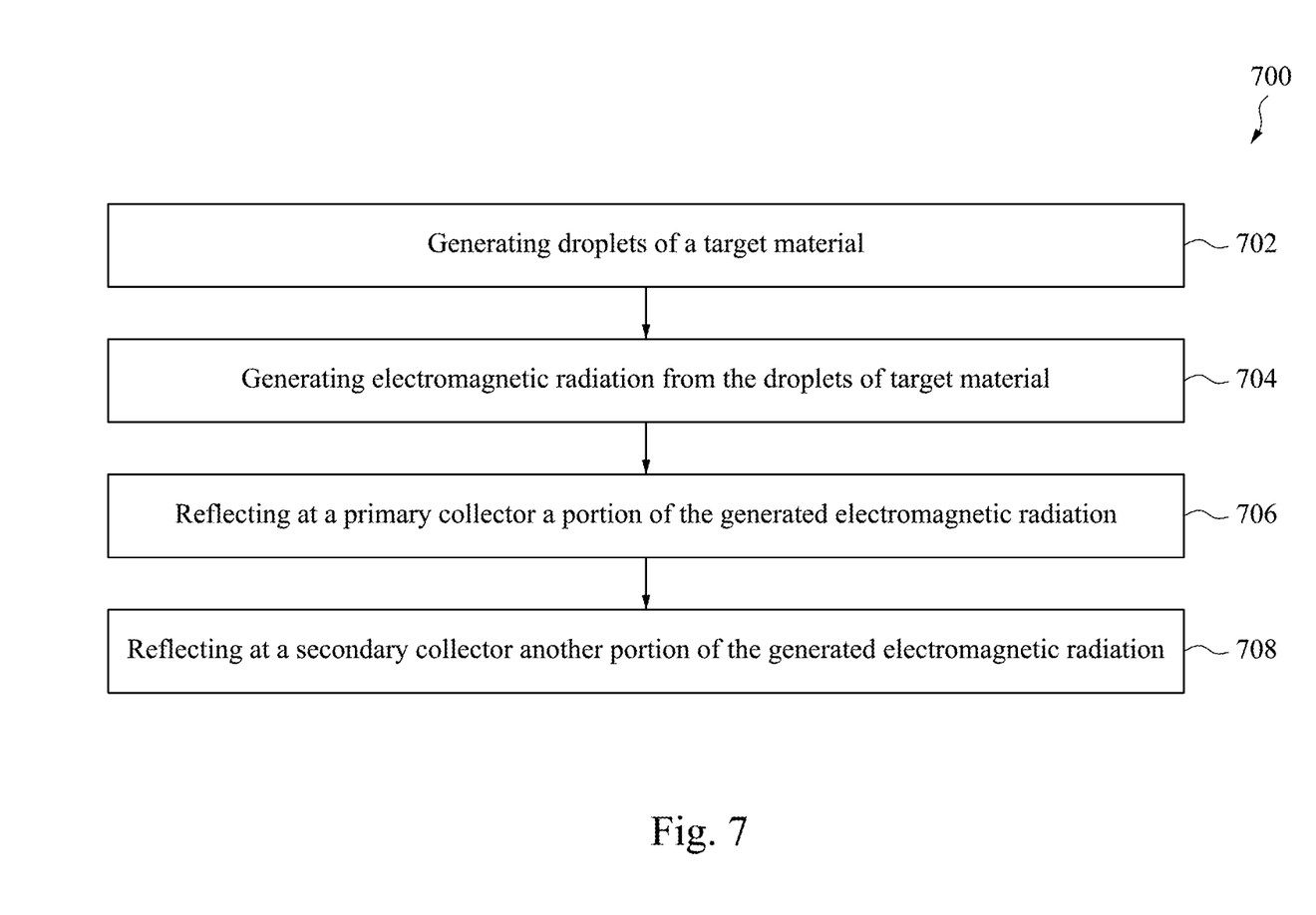
FIG. 7 is a flow diagram of a process in accordance with some embodiments.

Referring to FIG. 7, an embodiment of the present disclosure includes a method 700 for collecting electromagnetic radiation, e.g., electromagnetic radiation for use in a lithography process for exposing a material. The method 700 utilizes a secondary collector for collecting electromagnetic radiation, which would otherwise not be collected. Method 700 includes a first operation 702 of generating droplets of a target material, e.g., tin. Target droplet generator 26 in FIG. 2 is an example of a semiconductor tool useful in operation 702. Method 700 includes operation 704 of generating electromagnetic radiation from the droplets of target material. Electromagnetic radiation can be generated from the droplets of material by exposing the target droplets with a laser from laser source configuration 28 in FIG. 2. Method 700 includes operation 706 of reflecting, at a primary collector, a portion of the generated electromagnetic radiation to an intermediate focus point of the primary collector. Primary collector 31 in FIG. 2 is an example of a primary collector useful in operation 706. Method 700 includes operation 708 of reflecting, at a secondary collector, another portion of the generated electromagnetic radiation. Secondary collector 400 in FIGS. 4A-4C and secondary collector 500 in FIG. 5 are examples of secondary collectors useful in operation 708. In accordance with embodiments of the present disclosure, use of the secondary collector to collect generated electromagnetic radiation, in addition to the electromagnetic radiation collected by the primary collector, increases the conversion efficiency of the laser to electromagnetic radiation for use in a lithography process.

Figure 8:
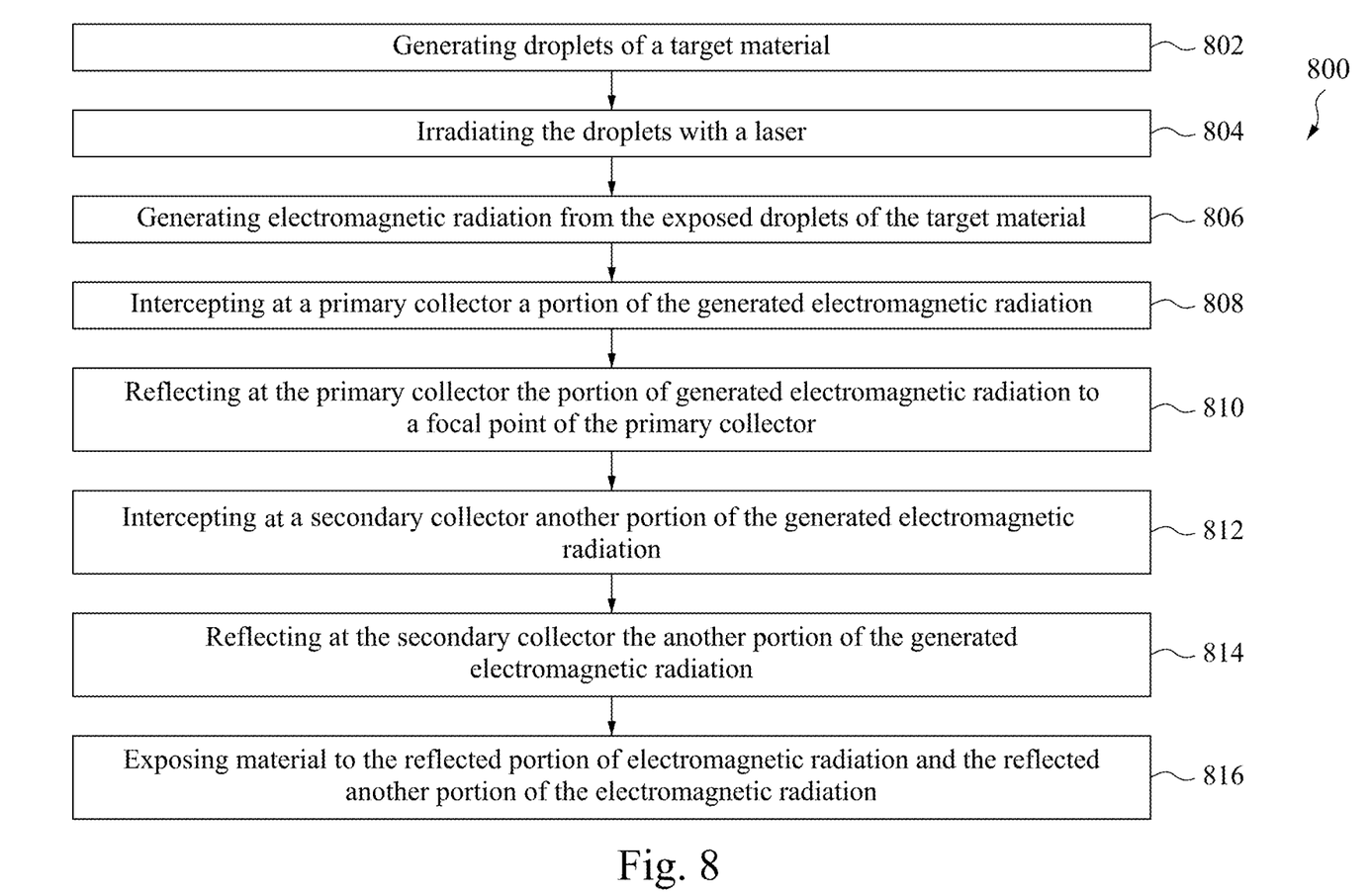
FIG. 8 is a flow diagram of a process in accordance with some embodiments.

In another embodiment of the present disclosure, a method 800 of FIG. 8 is provided. Method 800 is a method of photolithographically patterning a material, e.g., a material used in processes for manufacturing semiconductor devices. The method 800 utilizes a secondary collector for collecting and reflecting electromagnetic radiation, which would otherwise not be collected and reflected, to an intermediate focus point of a primary collector. Method 800 is initiated at operation 802 by generating droplets of a target material, e.g., tin. Target droplet generator 26 in FIG. 2 is an example of a semiconductor tool useful in operation 802. Method 800 includes operation 804 of irradiating the droplets of target material with a laser. Laser source configuration 28 of FIG. 2 is an example of a processing tool useful for generating laser that irradiates the droplets in operation 804. Method 800 includes operation 806 of generating electromagnetic radiation from the exposed droplets of the target material. Irradiating droplets of the target material with a laser from laser source configuration 28 of FIG. 2 is an example of how electromagnetic radiation is generated in operation 806. Method 800 includes operation 808 of intercepting at a primary collector, e.g., primary collector 31 in FIGS. 4A-4C, a portion of the electromagnetic radiation generated in operation 806. Method 800 proceeds with operation 810 of reflecting, at the primary collector, the intercepted portion of generated electromagnetic radiation to an intermediate focus point of the primary collector. At operation 812 of method 800, another portion of the generated electromagnetic radiation is intercepted at a secondary collector, e.g., collector ring 400 in FIGS. 4A-4C. At operation 814 of method 800, the another portion of generated electromagnetic radiation intercepted at the secondary collector is reflected to an intermediate focus point of the primary collector. Method 800 proceeds with operation 816 of exposing material to the reflected portion of the electromagnetic radiation and the reflected another portion of the electromagnetic radiation. Illuminator 14, mask stage 16 and projection optics 20 are examples of semiconductor process tools useful in carrying out operation 816. In accordance with embodiments of the present disclosure, use of the secondary collector to collect generated electromagnetic radiation, in addition to the electromagnetic radiation collected by the primary collector, increases the conversion efficiency of the laser to electromagnetic radiation for use in a lithography process.

One aspect of this description relates to a method of collecting electromagnetic radiation, e.g., EUV radiation, which will be used in a EUV lithography process to manufacture a semiconductor device. The method generates droplets of a target material, such as tin, and irradiates them with a laser. EUV radiation is emitted by the irradiated droplets of target material. A portion of the emitted EUV radiation is reflected at a primary collector to a focal point of the primary collector. This focal point of the primary collector is also referred to as an intermediate focus point. The method also reflects, at a secondary collector, another portion of the generated electromagnetic radiation to the focal point of the primary collector. The secondary collector collects and reflects radiation that would otherwise not be directed to the focal point of the primary collector because such radiation would not be collected and reflected by the primary collector.

Another aspect of this description relates to a method of photolithographically patterning a material, such as a material used in a process to manufacture a semiconductor device. The method includes the step of generating droplets of a target material, e.g., tin. These droplets are irradiated with a laser to initiate generation of electromagnetic radiation by droplets of target material. A portion of the generated electromagnetic radiation is intercepted, at a primary collector. The intercepted portion of the generated electromagnetic radiation is reflected by the primary collector to a focal point of the primary collector. Another portion of the generated electromagnetic radiation is intercepted at a secondary collector. The intercepted another portion of the generated electromagnetic radiation is reflected by the secondary collector to a focal point of the primary collector. The portion of the generated electromagnetic radiation reflected by the primary collector and the another portion of the generated electromagnetic radiation reflected by the secondary collector is utilized to expose a material. The secondary collector collects and reflects radiation that would otherwise not be directed to the focal point of the primary collector because such radiation would not be collected and reflected by the primary collector.

Still another aspect of this description relates to a radiation source for generating electromagnetic radiation for use in a lithography exposure process. The radiation source includes a source of target material droplets, a source of a laser, a primary collector of radiation generated from the target material droplets and a secondary collector of radiation generated by the target material droplets. The primary collector collects a portion of the radiation generated from the target material droplets and directs it to an intermediate focus point of the radiation source. The secondary collector collects another portion of the radiation generated from the target material droplets and directs it to the same intermediate focus point of the radiation source. The combined electromagnetic radiation that arrives at the intermediate focus point of the radiation source is utilized to expose a material in a semiconductor process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of collecting electromagnetic radiation, the method comprising:
generating droplets of a target material;
generating electromagnetic radiation from the droplets of the target material at a location;
reflecting, at a primary collector having a reflective surface oriented to face upward in a direction opposite to gravitational acceleration and that is positioned directly below the location of the generated electromagnetic radiation, a portion of the generated electromagnetic radiation to a focal point of the primary collector; and
reflecting, at a ring-shaped secondary collector that is positioned so that a portion thereof lies in a horizontal plane defined as a plane perpendicular to gravitational acceleration and at the same level as the location at which the electromagnetic radiation is generated, another portion of the generated electromagnetic radiation to the focal point of the primary collector,
wherein an innermost portion of a reflective surface of the secondary collector is positioned radially outward from the primary collector so that the reflective surface of the secondary collector does not vertically overlap the primary collector, thereby preventing droplets of the target material from dripping from the secondary collector onto the primary collector.

2. The method of claim 1, further comprising:
monitoring, by at least one sensor positioned between the primary collector and the secondary collector, the target material; and
wherein generating electromagnetic radiation from the droplets of the target material irradiating the droplets of the target material with a laser based at least in part on the monitoring of the target material by the at least one sensor.

3. The method of claim 1, wherein the reflecting, at the secondary collector, another portion of the generated electromagnetic radiation includes reflecting the another portion of the generated electromagnetic radiation from a surface of the secondary collector that has an elliptical concave profile.

4. The method of claim 3, wherein the generating electromagnetic radiation from the droplets of the target material includes generating electromagnetic radiation from the droplets of the target material at a focus of an ellipse defining the elliptical concave profile of the secondary collector.

5. The method of claim 4, wherein the reflecting, at the secondary collector, another portion of the generated electromagnetic radiation includes reflecting the another portion of the generated electromagnetic radiation to a focus of the ellipse defining the elliptical concave profile of the secondary collector.

6. The method of claim 1, wherein the reflecting, at the secondary collector, another portion of the generated electromagnetic radiation includes reflecting the another portion of the generated electromagnetic radiation directly from the secondary collector to the focal point of the primary collector.

7. The method of claim 1, wherein the target material is tin.

8. The method of claim 1, wherein the another portion of the generated electromagnetic radiation propagates in a direction that does not intersect with the primary collector.

9. A method of photolithographically patterning a material, the method comprising:
generating droplets of a tin target material;
irradiating the generated droplets of the tin target material with a laser;
generating electromagnetic radiation from the exposed droplets of the tin target material;
intercepting, at a primary collector having a reflective surface oriented to face upward in a direction opposite to gravitational acceleration and positioned directly below the predetermined location, a portion of the generated electromagnetic radiation;
reflecting, at the primary collector, the portion of the generated electromagnetic radiation to a focal point of the primary collector;
intercepting, at a secondary collector that is ring-shaped and positioned so that a portion thereof lies in a horizontal plane defined as a plane perpendicular to gravitational acceleration and at the same level as the predetermined location, another portion of the generated electromagnetic radiation;
reflecting, at the secondary collector, the another portion of the generated electromagnetic radiation to the focal point of the primary collector; and
exposing the material to the reflected portion of electromagnetic radiation and reflected another portion of electromagnetic radiation.

10. The method of claim 9, wherein the intercepting, at a secondary collector, the another portion of the generated electromagnetic radiation includes intercepting the another portion of the generated electromagnetic radiation at a surface of the secondary collector that has an aspheric profile.

11. The method of claim 10, wherein the aspheric profile is an elliptical profile.

12. The method of claim 9, wherein irradiating the generated droplets of the tin target material with a laser includes irradiating the generated droplets of the tin target material with a laser at a focus of an ellipse defining an elliptical profile of the secondary collector.

13. The method of claim 9, wherein the reflecting, at the secondary collector, the another portion of the generated electromagnetic radiation to the primary collector includes reflecting the another portion of the generated electromagnetic radiation to a focus of an ellipse defining an elliptical profile of the secondary collector.

14. The method of claim 9, wherein the generating electromagnetic radiation from the exposed droplets of the tin target material includes generating EUV radiation from the exposed droplets of the tin target material.

15. A radiation source for generating electromagnetic radiation for a lithography exposure process, the radiation source comprising:
a source of target material droplets;
a source of a laser, wherein radiation from the source of the laser intersects the target material droplets at a location;
a primary collector having a reflective surface oriented to face upward in a direction opposite to gravitational acceleration and positioned directly below the location, the primary collector including a reflective surface having a focal point; and
a ring-shaped secondary collector that is positioned so that a portion thereof lies in a horizontal plane defined as a plane perpendicular to gravitational acceleration and at the same level as the predetermined location, and includes a reflective surface configured to reflect electromagnetic radiation to the focal point of the primary collector,
wherein an innermost portion of the reflective surface of the secondary collector is positioned radially outward from the primary collector so that the reflective surface of the secondary collector does not vertically overlap the primary collector, thereby preventing droplets of the target material from dripping from the secondary collector onto the primary collector.

16. The radiation source of claim 15, wherein an innermost portion of the reflective surface of the secondary collector is positioned outside of the primary collector such that the reflective surface does not vertically overlap with the primary collector, thereby preventing droplets of the target material from dripping from the secondary collector onto the primary collector.

17. The radiation source of claim 15, wherein the reflective surface of the secondary collector has an elliptical profile defined by an ellipse.

18. The radiation source of claim 17, wherein the ellipse includes a first focus and a second focus, the first focus positioned at the focal point of the primary collector.

19. The radiation source of claim 18, wherein the second focus of the ellipse is positioned at the location where the laser intercepts target material droplets.

20. The radiation source of claim 17, wherein the reflective surface of the secondary collector includes an elliptical portion and a spherical portion.

* * * * *